United States Patent [19]

Hardy et al.

[11] 3,962,632

[45] June 8, 1976

[54] ROTATING DISC EXCESS CONSUMPTION WATTHOUR METER WITH RESTRAINING MEANS MOVABLY MOUNTED ON THE DISC

[75] Inventors: Samuel G. Hardy; Joseph L. Peterson, both of Durham, N.H.

[73] Assignee: General Electric Company, Schenectady, N.Y.

[22] Filed: Jan. 22, 1975

[21] Appl. No.: 543,284

[52] U.S. Cl. ............................. 324/137; 324/125; 335/225
[51] Int. Cl.² ..................... G01R 1/14; G01R 11/10
[58] Field of Search .................. 324/125, 137, 138; 310/183, 268; 335/225; 188/267

[56] References Cited
UNITED STATES PATENTS

| 745,461 | 12/1903 | Stern et al. | 324/138 |
| 2,940,044 | 6/1960 | Warsaw | 324/137 X |
| 3,248,651 | 4/1966 | Mindt et al. | 324/137 |
| 3,493,905 | 2/1970 | Foulke et al. | 324/125 X |

*Primary Examiner*—Gerard R. Strecker
*Attorney, Agent, or Firm*—Vale P. Myles

[57] ABSTRACT

A restraining means of mildly magnetic material is adjustably implanted in the rotor disc of a conventional watthour meter. The restraining means interacts with a magnetic field generated by the meter's damping magnet to stop the disc from turning when the rate of energy consumption in the metered circuit is below a predetermined rate. The predetermined rate can be altered by varying the radial distance between the center of the disc and the restraining means and by varying the amount of magnetic material passing through the field of the damping magnet.

5 Claims, 5 Drawing Figures

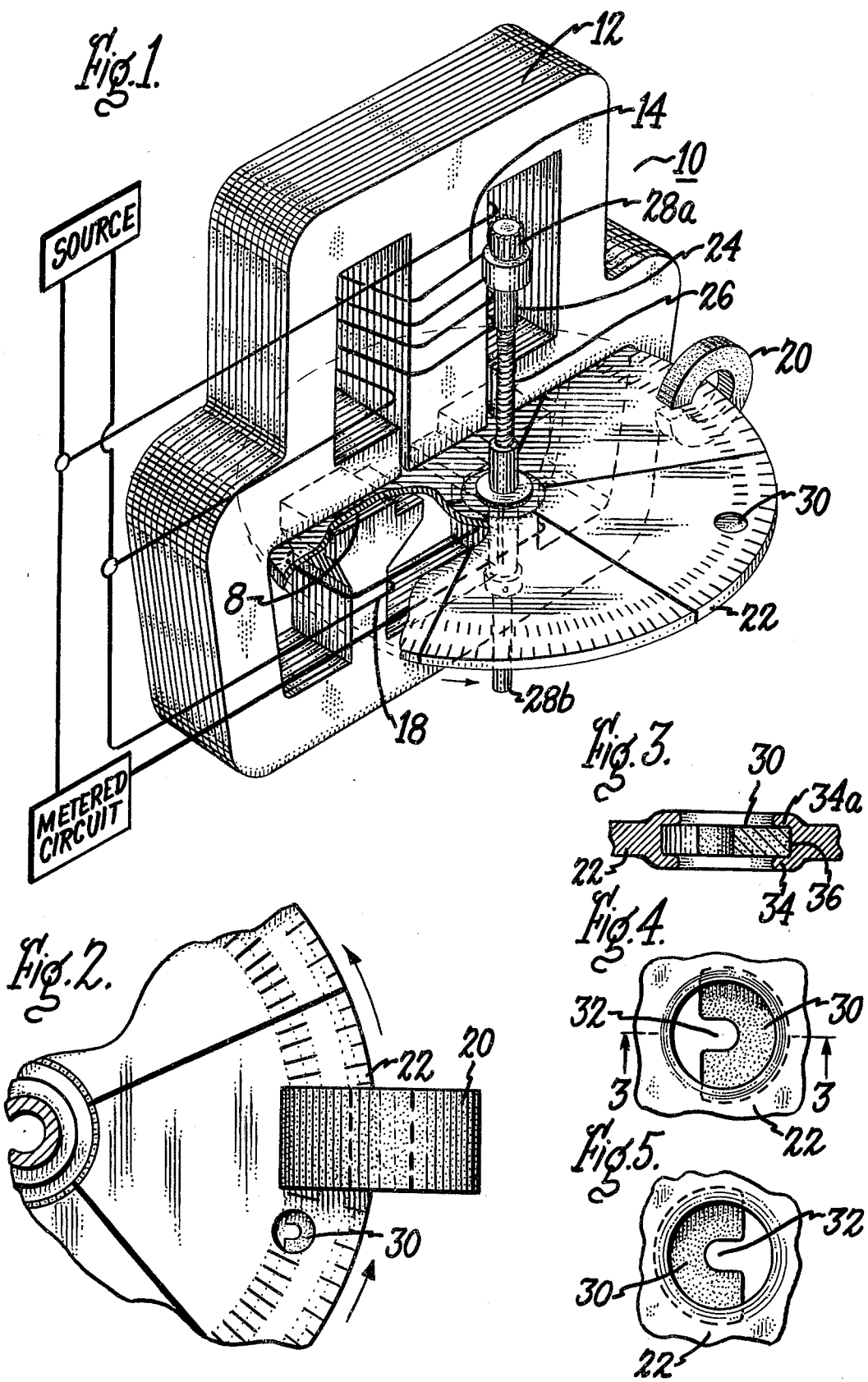

ROTATING DISC EXCESS CONSUMPTION WATTHOUR METER WITH RESTRAINING MEANS MOVABLY MOUNTED ON THE DISC

BACKGROUND

This invention relates to a method and apparatus for measuring electrical energy and, in particular, a method and apparatus for measuring electrical energy consumed at a rate of consumption.

An electrical utility provides consumers with an electrical energy service and measures each consumer's use of the service. Providing this service, the utility incurs production, distribution and other operating costs. These costs are recovered from consumers, preferably in the form of an equitable pro rata contribution from each consumer based upon those costs attributable to each consumer. It is recognized that a portion of the costs attributable to any one consumer depends upon two quantities: the total amount of electrical energy used by the consumer and the rate at which the consumer uses that energy. Hence, it is desirable for utilities to physically measure both quantities.

There are meters which can directly or indirectly measure these quantities. A rotating disc watthour meter is typically used to directly measure total energy in units of watthours. The construction and operation of conventional rotating disc meters is well known and can be found in Electrical Metermen's Handbook, Chapter 7, Edison Electric Institute, 7th ed., 1965.

Rate of energy usage, commonly termed power or demand, is equal to the instantaneous product of voltage and current. Because demand in an instantaneous quantity which can widely fluctuate during a given time interval, it is desirable to have a method of indirectly measuring this quantity. One such method is to measure electrical energy consumed during a period when demand exceeds a predetermined level. The conventional rotating disc meter can be equipped with a differential gearing mechanism to perform this measurement. Such differential gear excess consumption meters are disclosed in the reference, supra, beginning at page 312. However, the required differential gear mechanism is complex and expensive.

There are also known means for locking a rotor disc. The reference, supra, at p. 107 describes relatively small, non-adjustable anti-creep holes. These holes are placed in the rotor disc to distort the eddy currents in the disc and thereby create a relatively small locking torque. In order to lock the rotor under load condition, the size of the anti-creep holes has to be increased. However, increasing the size of the holes further distorts the rotor disc eddy currents. This upsets otherwise reliable meter characteristics thereby reducing meter accuracy.

The foregoing disadvantages are overcome by an excess consumption watthour meter which contains an amount of mildly magnetic material coupled to the rotor disc.

SUMMARY OF THE INVENTION

It is an object of this invention to provide a method and apparatus for measuring electrical energy consumed at a rate in excess of a predetermined threshold rate of consumption.

Another object of this invention is a method and apparatus for adjusting the predetermined threshold.

A further object is a method and apparatus for magnetically restraining the rotation of a watthour meter disc until a predetermined threshold demand is exceeded and for adjusting the predetermined threshold.

Another object is a meter rotor disc having an adjustable implanted magnetic restraining means for restraining the rotor when power is less than a predetermined level.

The invention comprises an excess consumption watthour meter including an alternating current induction motor having a stator and rotor, a damping means, and a magnetic restraining means for preventing the rotor from turning when the rate of electrical energy consumption is less than a predetermined threshold rate and means for adjusting that predetermined threshold.

The stator consists of two inductive coils electrically connected with the metered circuit to generate a magnetic field. One coil is connected across the circuit, and is responsive to the voltage of the circuit. The other coil is connected in series with circuit and is responsive to the current. When the coils are energized they generate a magnetic field whose magnitude is proportional to the instantaneous product of voltage and current, i.e. power or demand.

The rotor, made from conductive material, is rotatably mounted and spatially positioned so that a portion of the rotor passes through the stator's generated magnetic field. This field induces eddy currents of electricity in that portion of the rotor within the field. The eddy currents produce another field which interacts with the stator's field to produce a driving torque which causes the rotor to turn.

A portion of the rotor passes through the damping means comprising a permanent signal which generates a damping magnetic field. Other eddy currents are induced in the rotor and these eddy currents react with the damping field to cause a damping torque which controls the speed of the rotor and prevents acceleration. Under the influence of the driving and damping torques, the rotor assumes an angular velocity directly proportional to power and each revolution of the rotor becomes equivalent to a fixed quantity of energy.

In combination with the induction motor and the damping means is a restraining means comprising an amount of mildly magnetic material. The restraining means is coupled to the rotor disc at a radial position which periodically passes through the damping magnet's field. When the restraining means enters that field, a magnetic force is exerted on the restraining means which tends to prevent the restraining means from leaving the field. This force is applied to the rotor with a mechanical advantage proportional to the radial distance of the restraining means from the center of the disc, and is dependent upon the amount of magnetic restraining means material within the field. Hence, a counter-torque is exerted on the rotor which prevents further rotation until the driving torque (proportional to power) exceeds the counter-torque.

The counter-torque can be adjusted by changing the radial distance from the center of the disc to the restraining means and by changing the amount of magnetic material within the damping magnetic field. By proper adjustment, the rotor will be prevented from turning until a predetermined threshold rate of consumption is exceeded. Then the rotor will turn and each turn will be representative of a fixed quantity of energy consumed in excess of the predetermined threshold.

BRIEF DESCRIPTION OF DRAWING

FIG. 1 is a perspective view of the invention;

FIG. 2 is a partial planar view of the rotor, restraining means and damping means;

FIG. 3 is a partial elevation in section showing the restraining means mounted in the rotor in a groove-and-roll-over arrangement;

FIG. 4 is a detailed planar view of a portion of the rotor and the restraining means at maximum threshold rate adjustment; and FIG. 5 is similar to FIG. 4 and shows the restraining means at minimal threshold rate adjustment.

DETAILED DESCRIPTION OF THE PREFERRED EMBODIMENT

A preferred embodiment of applicant's invention is shown in FIG. 1 of the drawings. As formed, the invention comprises a motor 10, a damping means 20, and a restraining means 30. The construction and operation of the motor and damping means of the preferred embodiment are well known. They are components of a typical rotating disc watthour meter and a detailed description of each component and its operation may be found in the reference cited above. However, the following description is presented to show how these components are combined and cooperate with the restraining means to form the preferred embodiment.

The motor 10 is of the alternating current induction type. It comprises an electromagnet which has two sets of windings 14, 18 assembled on a laminated, soft-iron core 12. One winding, termed the potential or shunt coil 14, is connected across the metered circuit; the other winding, termed the current or series coil 18, is connected in series with the metered circuit. The potential coil 14 comprises many turns of wire and is of a relatively high impedance. The current coil 18 consists of relatively few turns of heavy wire so that its resistance and impedance are low and it introduces a negligible voltage drop in the metered circuit. The core laminations are of suitable shape to provide a desired magnetic field distribution.

The rotor comprises a disc 22, made from a conductive material and mounted concentrically on a shaft 24. The shaft 24 is a solid metal rod which is free to turn in bearings 28a, b held in a meter frame (not shown). A worm gear 26 is generally cut directly into the shaft and in turn drives a register (also not shown) which counts the number of revolutions of the rotor. The rotor is mounted so that a portion of the disc rotates in the air gap 8 between the coils 14, 18 of the stator.

A watthour meter of the invention may have one or more damping means, such as permanent magnets. The preferred embodiment uses a single damping means which is a circular shaped bipolar permanent magnet 20 having between its two poles a space within which is a damping magnetic field. The damping magnet 20 is spatially positioned with respect to the rotor 10 so that a portion of the periphery of the rotor disc 22 passes through the damping magnetic field.

The restraining means 30 in the preferred embodiment is a semi-circular body of mildly magnetic material, such as stainless steel. It is mounted in that portion of disc 22 which passes through the field of damping magnet 20. The restraining means interacts with the damping magnetic field to allow the rotor to turn only when the rate of energy consumption (power) exceeds a predetermined value and prevents rotation when the rate is less than that value. As a result, when disc 22 begins to turn, each turn represents a fixed quantity of electrical energy consumed in the material circuit at a rate in excess of the predetermined rate.

As shown in FIG. 3, the restraining means 30 is mounted in disc 22 with a groove-and-roll-over arrangement. Groove 36 is cut into the body of disc 22, the restraining means is inserted in the groove and roll-overs 34a, b hold the restraining means in place. This arrangement allows the restraining means to be rotated within the groove. A slot 32 is provided within the restraining means. A tool, such as a screwdriver (not shown) can be inserted in the slot and the restraining means adjusted to a desired position. The position shown in FIG. 4 shows the restraining means at its maximum threshold adjustment; FIG. 5 shows the minimum threshold adjustment position.

At any given instant, a driving torque results from interaction between a magnetic field produced by the current flowing in the shunt coil 14 and the series coil 18. Eddy currents are induced in the disc 22 as a result of that magnetic field. When energy is consumed in the metered circuit, series coil 18 is energized. As a result, a magnetic field is generated in the air gap 8 between the two coils. Because the disc cuts the magnetic field produced by the current in each of the two coils, potentials are induced in the part of the disc that is in the air gap 8 betweeen the coils. Since the disc provides closed circuits, the induced potentials cause alternating eddy currents to flow in disc 22. These currents react with the magnetic field to produce a torque which tends to rotate the disc in a counterclockwise direction indicated by the arrow in FIG. 1.

If allowed to turn uncontrolled, the disc 22 would accelerate under the influence of the driving torque. To correct this situation and to render the angular velocity of the disc representative of the power in the metered circuit, the damping means 20 loads the motor to a degree sufficient to reduce the rotor speed to a useful value. As the disc turns, it cuts the field of the damping magnet 20 and thereby causes voltages to be induced in the disc. These voltages produce eddy currents proportional to the speed of the disc. Those currents in turn react with the permanent magnetic field to produce a damping torque opposed to the driving torque. As a result, the disc turns at a speed representative of the power in the metered circuit and even turn of the disc represents a fixed quantity of electrical energy.

As indicated by the arrows in FIG. 2, the disc is rotating counterclockwise and the restraining means is about to enter and intersect the field of the damping magnet 20. Once it intersects the field, a magnetic force is exerted upon restraining means 30 which force tends to prevent the restraining means 30 from leaving the field generated by damping magnet 20. Because the restraining means 30 is adapted to rotor disc 22, a counter-torque is applied to the rotor thereby preventing further rotation. The rotor will remain stopped until the driving torque, which is proportional to power, exceeds the counter-torque.

When the restraining means is adjusted to the position shown in FIG. 4, most of the restraining means 30 will pass through the damping magnet's field and the restraining means 30 is at its maximum radial distance from the center of rotor disc 22. In this position, the counter-torque exerted on the rotor 20 will be maximal; hence this position corresponds to the maximum threshold rate. In FIG. 5, little of restraining means 30 will pass through the damping magnet's field and the restraining means is at a minimal radial distance from the center of disc 22. As a result, only a minimal counter-torque will be exerted on the rotor 20; hence the position shown therein corresponds to the minimum threshold rate. Any given restraining means position will stop the rotor until driving torque exceeds a certain value. This value will correspond to a particular rate of electrical energy consumption, i.e. power. Hence the rate of consumption which will result in a driving torque which will overcome the counter-torque and turn the rotor corresponds to the given restraining means position. By varying the position, the threshold rate of consumption above which the rotor will turn can be selectively altered.

DISCUSSION

The foregoing description of a preferred embodiment describes the invention as used in a single phase two line system. However, the invention is not limited to such a system and may be employed in any single phase or any polyphase, N line system in accordance with Blondel's theorem: the power in a circuit of N lines can be metered by N elements with the potential circuits connected from each line to a common point; if the common point is on one of the lines, the power can be metered by N-1 elements.

One advantage of the invention is that an existing watthour meter can be converted to an excess rate watthour meter by simply substituting a rotor containing a restraining means for the normal watthour rotor. The restraining means causes negligible interference with the normal operating characteristics of the watthour meter once the threshold rate is exceeded.

In the preferred embodiment the restraining means has a semi-circular shape and is mounted in a groove-and-roll-over arrangement. It will be appreciated that the invention is not limited to this particular shape of restraining means and mounting method. Those skilled in the art will know that alternate mounting and adjusting means are useable. One such alternate means includes tubularly shaping the restraining means, mounting it in a radial groove and moving it radially within the groove to alter its interaction with the damping magnetic field. Another includes an elongated mildly magnetic member coupled in the rotor's shaft near the disc and adjustably extending into the damping magnetic field.

Moreover, the use of the damping magnetic field is not critical. What is critical is the interaction between a spatially fixed magnetic field and a magnetic restraining means coupled to the rotor at a position carrying the restraining means into fixed field. Such a fixed field may be supplied by some permanent magnet other than the damping magnet or by the magnetic field generated by the stator.

The restraining means can be made from a variety of materials. The preferred material is mildly magnetic. However, even permanently magnetic materials are useful as the following examples will illustrate.

EXAMPLE 1

A restraining means was coupled to the rotating disc of a conventional watthour meter containing two damping magnets. The restraining means consisted of B7A53C Type 201 stainless steel comprising approximately 17% chromium and 4% nickel. The magnetic permeability of the steel was approximately 1. The restraining means was semi-circular shaped, had a diameter of 7 mm and was rotatably coupled to the disc at a radius of 2.4 cm. The meter was conventionally connected to a source and a load. A steady load voltage was supplied from a 110 volt, 60 Hz source. Load current was increased from zero to approximately 3 amperes r.m.s. Initially the disc turned until the restraining means entered the magnetic field of one of the damping magnets. Then the disc stopped turning until the load current exceeded a threshold value of 3 amperes r.m.s whereupon the disc resumed rotating. Subsequent tests showed this threshold current could be varied ±1.0 amperes r.m.s. When the load current was decreased to the threshold current the disc again stopping turning and did not turn for any load current less than 3.0 amperes r.m.s. It was also noted that there was some interaction between the restraining means and the magnetic field generated by the meter's potential coil when the load current reached 1.8 amperes r.m.s.

EXAMPLE 2

The same procedures as set forth in EXAMPLE 1 were followed except the restraining means was made from a B7A41R Type 305 stainless steel comprising 18% chromium, 12% nickel and exhibiting a magnetic permeability less than 10. The restraining means was semi-circular shaped, had a diameter of 4mm. and was rotatably coupled to the disc at a radius of 2.7 cm. The threshold current was 5 amperes r.m.s. and could be varied approximately ±1.0 amperes r.m.s. by rotating the restraining means. Some interaction between the restraining means and the potential coil's magnetic field was observed when load current reached 1.2 amperes r.m.s.

EXAMPLE 3

The same procedures were followed as set forth in EXAMPLE 2 except the restraining means was made from silicon steel. The threshold current was 50 amperes r.m.s.

EXAMPLE 4

The same procedures were followed as set forth in EXAMPLE 2 except the restraining means was formed from cold rolled steel as of the type commonly found in paper clips. The threshold current was erratic, perhaps due to partial permanent magnetization of the restraining means.

EXAMPLE 5

A small chip of permanently magnetic material, such as the alnico type magnetic material used in the meter's damping system, was impressed on the disc. The chip had a mass of 0.0024 grams and was located at a radius of 3.2 cm. The source voltage was increased to 240 volts, 60 Hz. The threshold current was approximately 3 amperes r.m.s.

EXAMPLE 6

The same chip described in EXAMPLE 5 was positioned on the disc at a radius of 4.0 cm. The resulting threshold current was 15 amperes r.m.s.

While the present invention had been disclosed in connection with a preferred embodiment and the foregoing examples, it should be understood that there may be other obvious modifications of the invention which fall within the spirit and scope of the invention as defined by the appended claims.

We claim:

1. A watthour meter for measuring electrical energy in a circuit when a predetermined power is exceeded including:

a first inductive coil electrically connected across the metered circuit;

a second inductive coil electrically connected in series with the metered circuit, a rotor comprising a conductive disc axially mounted on a shaft, said disc at least partially positioned between said first and second coils; and a magnetic field, fixed in space and passing through a portion of the rotor disc; in combination with the improvement comprising;

a. a body of mildly magnetic material for interacting with the fixed magnetic field to stop the disc from turning when the rate of energy consumption is below a predetermined rate, said body being movably mounted on the rotor disc at a position that enables the body to be moved radially by a manually operated adjustment means through a fixed range of radial positions in each of which a portion of the body is intersected by said fixed magnetic field, and b. manually operable adjustment means for moving said body from its radially outermost position at one end of said fixed range to its radially innermost position at the other end of said fixed range, said body being positioned to more strongly interact with said fixed magnetic field when located at said outermost position than when located at said innermost position.

2. The invention of claim 1 wherein said mildly magnetic material comprises stainless steel.

3. The invention of claim 1 wherein:

a. the amount of mildly magnetic material is semicircularly shaped and rotatably mounted in the rotor disc and b. The adjustment means comprises a slot in the semicircular magnetic material.

4. An excess consumption watthour meter rotor comprising an axial shaft, a conductive disc mounted at its center on said shaft, a disc rotation restraining means for interacting with a magnetic field generated by the meter's damping magnet to stop the disc from turning when the rate of energy consumption in the meter circuit is below a predetermined rate comprising a body of mildly magnetic material movably mounted on said disc, and manual adjustment means for selectively varying the radial distance of said body from the center of the disc thereby to provide a maximum threshold adjustment for the restraining means by moving said body to its radial outermost position.

5. An excess consumption meter as defined in claim 4 wherein said body is mounted in an annular groove defined in said disc, and wherein said manual adjustment means comprises a tool-receiving slot defined in the body of magnetic material being effective to transmit a torque to said body from a manually operable tool positioned in the slot and rotated relative to said disc.

* * * * *